(12) United States Patent
Kawai et al.

(10) Patent No.: US 8,941,122 B2
(45) Date of Patent: Jan. 27, 2015

(54) SILICON CARBIDE SEMICONDUCTOR DEVICE AND METHOD OF MANUFACTURING THE SAME

(71) Applicant: DENSO CORPORATION, Kariya, Aichi-pref. (JP)

(72) Inventors: Jun Kawai, Anjo (JP); Norihito Tokura, Okazaki (JP); Kazuhiko Sugiura, Nagoya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 13/855,072

(22) Filed: Apr. 2, 2013

(65) Prior Publication Data

US 2013/0285070 A1    Oct. 31, 2013

(30) Foreign Application Priority Data

Apr. 3, 2012 (JP) .................................. 2012-84901

(51) Int. Cl.
*H01L 29/15* (2006.01)
*H01L 29/16* (2006.01)
*H01L 21/22* (2006.01)
*H01L 21/04* (2006.01)
*H01L 29/78* (2006.01)
*H01L 29/66* (2006.01)

(52) U.S. Cl.
CPC ............ *H01L 29/1608* (2013.01); *H01L 21/22* (2013.01); *H01L 21/0455* (2013.01); *H01L 21/0485* (2013.01); *H01L 29/7827* (2013.01); *H01L 29/66068* (2013.01)
USPC ...................... 257/77; 257/302; 257/E29.262

(58) Field of Classification Search
CPC . H01L 29/1608; H01L 21/22; H01L 29/7827; H01L 29/66068
USPC ................... 257/77, 302, E29.189, E27.054, 257/E27.096, E29.318, E29.262, E21.41
See application file for complete search history.

(56) References Cited

U.S. PATENT DOCUMENTS

| | | | | |
|---|---|---|---|---|
| 2002/0142548 | A1* | 10/2002 | Takaishi | 438/270 |
| 2005/0001268 | A1* | 1/2005 | Baliga | 257/341 |
| 2007/0066039 | A1 | 3/2007 | Agarwal et al. | |
| 2007/0194364 | A1* | 8/2007 | Kitada et al. | 257/302 |
| 2008/0303057 | A1* | 12/2008 | Iwamuro | 257/141 |
| 2011/0039382 | A1* | 2/2011 | Miyakoshi | 438/268 |

FOREIGN PATENT DOCUMENTS

| | | |
|---|---|---|
| JP | 08-139051 A | 5/1996 |
| JP | 08-139053 A | 5/1996 |
| JP | 2002-289550 A | 10/2002 |

(Continued)

OTHER PUBLICATIONS

Office Action mailed Apr. 8, 2014 issued in corresponding JP patent application No. 2012-084901 (and English translation).

*Primary Examiner* — Cuong Q Nguyen
*Assistant Examiner* — Yosef Gebreyesus
(74) *Attorney, Agent, or Firm* — Posz Law Group, PLC (57) ABSTRACT

In a manufacturing method of a silicon carbide semiconductor device, a semiconductor substrate made of single crystal silicon carbide is prepared. At a portion of the semiconductor substrate where a first electrode is to be formed, a metal thin film made of electrode material including an impurity is formed. After the metal thin film is formed, the first electrode including a metal reaction layer in which the impurity is introduced is formed by irradiating the metal thin film with a laser light.

1 Claim, 5 Drawing Sheets

(56) References Cited

FOREIGN PATENT DOCUMENTS

| | | |
|---|---|---|
| JP | 2004-158702 A | 6/2004 |
| JP | 2006-073923 A | 3/2006 |
| JP | 2008-135611 A | 6/2008 |
| JP | 2011-054788 A | 3/2011 |

* cited by examiner

SILICON CARBIDE SEMICONDUCTOR DEVICE AND METHOD OF MANUFACTURING THE SAME

CROSS REFERENCE TO RELATED APPLICATIONS

The present application is based on and claims priority to Japanese Patent Application No. 2012-84901 filed on Apr. 3, 2012, the contents of which are incorporated in their entirety herein by reference.

TECHNICAL FIELD

The present disclosure relates to a silicon carbide (hereafter, referred to as SiC) semiconductor device that can realize an ohmic junction of an electrode, and a manufacturing method of a SiC semiconductor device.

BACKGROUND

In a case where a vertical power device is formed in a SiC substrate, when an electrode for coupling the vertical power device with an electrical circuit is formed, especially, when a drain electrode is formed, it is desirable to form an ohmic electrode that reduces a contact resistance between the SiC substrate and the drain electrode.

Meanwhile, JP-A-2002-289550 discloses a method in which an ohmic electrode is obtained by irradiating a SiC substrate with a laser light. A forming process of a rear electrode using this method is performed as follows. Firstly, after an electrode is formed on a front surface side of a SiC substrate in which a vertical element is formed, a front surface of the SiC substrate is protected with a resin film, and a rear surface of the SiC substrate is thinned. Then, an ion implantation of an impurity is performed to the rear surface of the SiC substrate, and a laser light irradiation to the rear surface of the SiC substrate is performed. After that, a metal thin film is formed on the rear surface of the SiC substrate to form an electrode. Accordingly, an impurity layer that is activated by the laser light irradiation and the electrode can form an ohmic junction.

However, because it is required to perform the ion implantation of the impurity to the rear surface of the SiC substrate, there are problems that an ion implantation apparatus is expensive and an ion implantation process itself needs a high cost. Thus, it is desirable that an ohmic electrode can be obtained without the ion implantation process.

As this method, JP-A-2008-135611 suggests a method in which a laser light is emitted after a metal layer is formed on a SiC substrate. A forming process of a rear electrode using this method is performed as follows. Firstly, an electrode is formed on a front surface side of a SiC substrate in which a vertical element is formed. Next, a front surface of the SiC substrate is protected with a resin film, and the rear surface of the SiC substrate is thinned. Then, a metal layer is formed on a rear surface of the SiC substrate, and the metal layer is irradiated with a laser light. Accordingly, metal included in the metal layer and Si included in a SiC layer react to form metal silicide, thereby forming an ohmic junction.

However, it is difficult to obtain a sufficient low resistance ohmic junction only by forming the metal silicide without performing an ion implantation of an impurity, and it is desirable to obtain a lower resistance ohmic junction.

SUMMARY

An object of the present disclosure is to provide a manufacturing method of a SiC semiconductor device that can realize a low resistance ohmic junction without ion implantation of an impurity. Another object of the present disclosure is to provide a SiC semiconductor device that can realize a low resistance ohmic junction.

In a manufacturing method of a silicon carbide semiconductor device according to an aspect of the present disclosure, a semiconductor substrate that has a main surface and a rear surface being an opposite surface of the main surface and is made of single crystal silicon carbide is prepared. At a portion of the semiconductor substrate where a first electrode that forms an ohmic junction with the semiconductor substrate is to be formed, a metal thin film that is made of electrode material including an impurity is formed. After forming the metal thin film, the metal thin film is irradiated with a laser light, thereby concurrently diffusing a metal atom that forms the metal thin film and the impurity that is included in the metal thin film, and forming a metal reaction layer in which the metal atom reacts with at least one of carbon or silicon that forms the semiconductor substrate. Accordingly, the first electrode that includes a metal reaction layer in which the impurity is introduced is formed.

In a manufacturing method of a silicon carbide semiconductor device according to another aspect of the present disclosure, a semiconductor substrate that has a main surface and a rear surface being an opposite surface of the main surface and is made of single crystal silicon carbide is prepared. At a portion of the semiconductor substrate where a first electrode that forms an ohmic junction with the semiconductor substrate is to be formed, an impurity layer that is made of silicon carbide including an impurity and a metal layer that is made of an electrode material are stacked. After stacking the impurity layer and the metal layer, the impurity layer and the metal layer are irradiated with a laser light, thereby concurrently diffusing a metal atom that forms the metal layer and the impurity that is included in the impurity layer, and forming the metal reaction layer in which the metal atom reacts with at least one of carbon or silicon that forms the semiconductor substrate and the impurity layer. Accordingly, the first electrode that includes a metal reaction layer in which the impurity is introduced is formed.

A silicon carbide semiconductor device according to another aspect of the present disclosure includes a semiconductor layer that has a main surface and a rear surface being an opposite surface of the main surface and is made of single crystal silicon carbide and a first electrode that forms an ohmic junction with the semiconductor substrate. A junction portion of the first electrode with the semiconductor substrate is formed of a metal reaction layer in which an impurity included in the first electrode is introduced and a metal atom that forms the first electrode reacts with at least one of carbon or silicon that forms the semiconductor substrate. In the metal reaction layer, a diffusion depth of the impurity and a diffusion depth of the metal atom are the same.

BRIEF DESCRIPTION OF THE DRAWINGS

Additional objects and advantages of the present disclosure will be more readily apparent from the following detailed description when taken together with the accompanying drawings. In the drawings.

DETAILED DESCRIPTION

Embodiments of the present disclosure will be described with reference to drawings. In each of the following embodiments, the same or equivalent parts will be described with being designated by the same reference numerals.

First Embodiment

A first embodiment of the present disclosure will be described below. In the present embodiment, a SiC semiconductor device including a planar MOSFET (vertical power MOSFET) as a semiconductor element is given as an example. The present device is suitably applied to, for example, an inverter.

Figure 1:
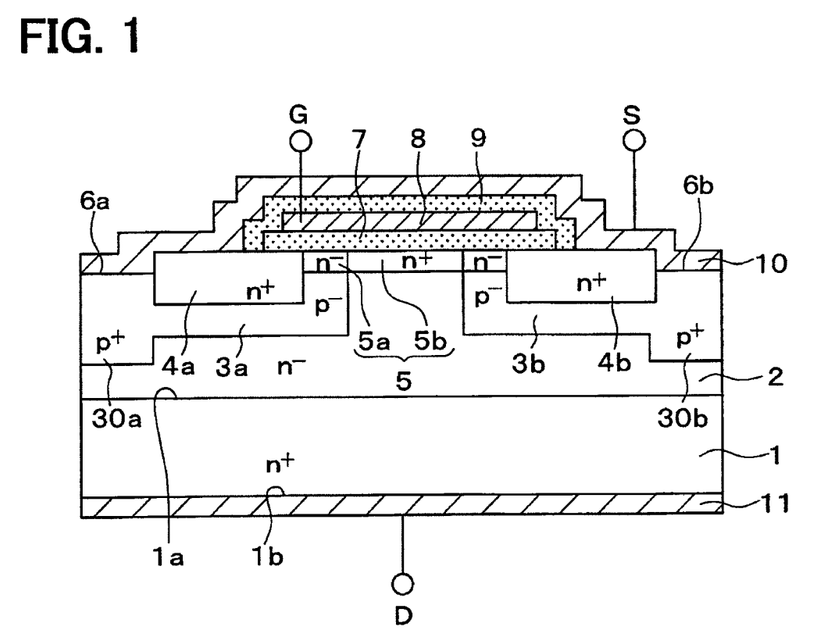
FIG. 1 is a cross-sectional view of a SiC semiconductor device that includes a vertical power MOSFET according to a first embodiment of the present disclosure.

As shown in FIG. 1, an n+ type semiconductor substrate (hereafter, referred to as an n+ type substrate) 1 has an upper surface which is set as a main surface 1a and a lower surface which is an opposite surface of the main surface 1a and is set as a rear surface 1b, and is made of single crystal SiC. A thickness of the n+ type substrate 1 is, for example, 350 μm. The n+ type substrate 1 has an n type impurity concentration of, for example, from $1 \times 10^{17}$ cm$^{-3}$ to $1 \times 10^{18}$ cm$^{-3}$. On the main surface 1a of the n+ type substrate 1, an n− type epitaxial layer 2 made of SiC having a lower dopant concentration than the n+ type substrate 1 is stacked.

At a predetermined region in a surface portion of the n− type epitaxial layer 2, a p− type base region 3a and a p− type base region 3b having predetermined depths are formed to be separated from each other. In the p− type base regions 3a, 3b, deep base layers 30a, 30b having larger thicknesses are formed. The deep base layers 30a, 30b are formed at portions which do not overlap n+ type source regions 4a, 4b. Thicker portions in the p− type base regions 3a, 3b at which the deep base layers 30a, 30b are formed have higher impurity concentration than thinner portions in the p− type base regions 3a, 3b at which the deep base layers 30a, 30b are not formed.

Due to the deep base layers 30a, 30b, a thickness of the n− type epitaxial layer 2 under the deep base layers 30a, 30b is reduced (a distance between the n+ type substrate 1 and the deep base layers 30a, 30b is reduced), an electric field strength can be increased, and avalanche breakdown can be easily caused.

At a predetermined region in a surface portion of the p− type base region 3a, an n+ type source region 4a shallower than the p− type base region 3a is formed. At a predetermined region in a surface portion of the p− type base region 3b, an n+ type source region 4b shallower than the p− type base region 3b is formed.

Furthermore, at surface portions of the n− type epitaxial layer 2 and the p-type base regions 3a, 3b between the n+ type source region 4a and the n+ type source region 4b, an n− type SiC layer 5 including an n− type layer 5a and an n+ type layer 5b extends. In other words, in the surface portions of the p− type base regions 3a, 3b, the n− type SiC layer 5 is arranged so as to connect the source regions 4a, 4b and the n− type epitaxial layer 2. The n− type SiC layer 5 functions as a channel forming layer on a device surface when the device operates. Hereafter, the n− type SiC layer 5 is referred to as a surface channel layer.

In the surface channel layer 5, a dopant concentration of the n− type layer 5a disposed above the p− type base regions 3a, 3b is a low concentration about $1 \times 10^{15}$ cm$^{-3}$ to $1 \times 10^{17}$ cm$^{-3}$, and is less than the dopant concentrations of the n− type epitaxial layer 2 and the p− type base regions 3a, 3b. Accordingly, an on-resistance is reduced.

In surface portions of the p− type base regions 3a, 3b and the n+ type source regions 4a, 4b, depressed portions 6a, 6b for contact are formed.

On an upper surface of the surface channel layer 5 and upper surfaces of the n+ type source regions 4a, 4b, a gate insulating layer (silicon oxide layer) 7 is formed. In addition, on the gate insulating layer 7, a gate electrode 8 is formed. The gate electrode 8 is covered with an insulating layer 9. As the insulating layer 9, a silicon oxide layer is used. On the insulating layer 9, a source electrode 10 is formed. The source electrode 10 is in contact with the n+ type source regions 4a, 4b and is in contact with the p− type base regions 3a, 3b through the depressed portions 6a, 6b. On a rear surface 1b of the n+ type substrate 1, a drain electrode 11 is formed. The drain electrode 11 forms an ohmic junction with the rear surface 1b of the n+ type substrate 1.

In the present embodiment, the drain electrode 11 corresponds to a first electrode, and a portion in the n+ type substrate 1 where the drain electrode 11 is formed corresponds to a portion where the first electrode is formed.

A manufacturing method of the vertical power MOSFET shown in FIG. 1 will be described with reference to FIG. 2A to FIG. 2D and FIG. 3. A basic manufacturing method of the vertical power MOSFET according to the present embodiment is similar to that of a conventional manufacturing method. Therefore, only a process of forming the drain electrode 11 that is different from the conventional manufacturing method will be described. Note that an element structure of the vertical power MOSFET is not illustrated in FIG. 2 for simplicity.

Figure 2A:
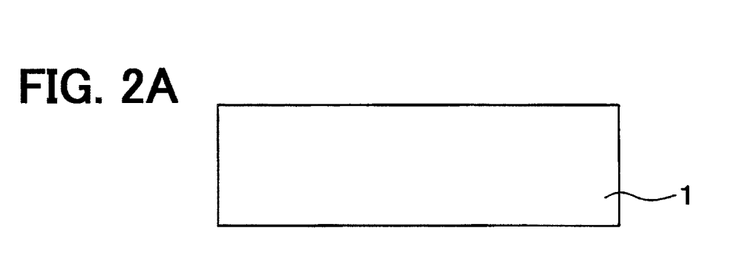
FIG. 2A though FIG. 2D are cross-sectional views showing processes of forming a drain electrode of the SiC semiconductor device shown in FIG. 1.

Firstly, in a process shown in FIG. 2A, a work piece in which the device shown in FIG. 1 is formed on the front surface side of the n+ type substrate 1, that is, a work piece in which components to the source electrode 10 except for the drain electrode 11 is formed is prepared. Then, the n+ type substrate 1 is thinned so that the thickness of the n+ type substrate 1 becomes 350 μm.

Figure 2B:
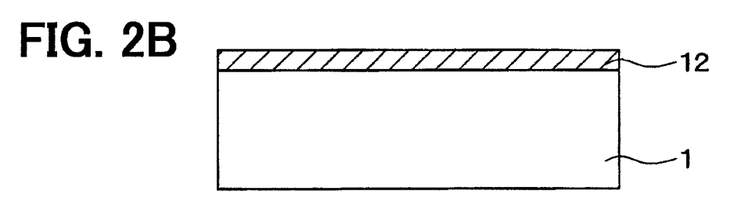

Next, in a process shown in FIG. 2B, a metal thin film 12 including an impurity is formed on the rear surface 1b of the n+ type substrate 1. The metal thin film 12 is made of one or both of electrode materials that form metal silicide or metal carbide with SiC, such as nickel (Ni) or molybdenum (Mo). When both the electrode materials are used, mixed material of the electrode materials may be used, or thin films made of respective electrode materials may be stacked. A concentration of the impurity is set to be 10 ppm to 2% so that the concentration becomes a level of an impurity concentration expected for ion implantation. In the present embodiment, the n channel type vertical power MOSFET is given as the example of the semiconductor element. Thus, the drain electrode 11 forms the ohmic junction with the n+ type substrate, that is, n type SiC. Therefore, an n type impurity, such as phosphorous (P) is doped to the metal thin film 12.

Figure 3:
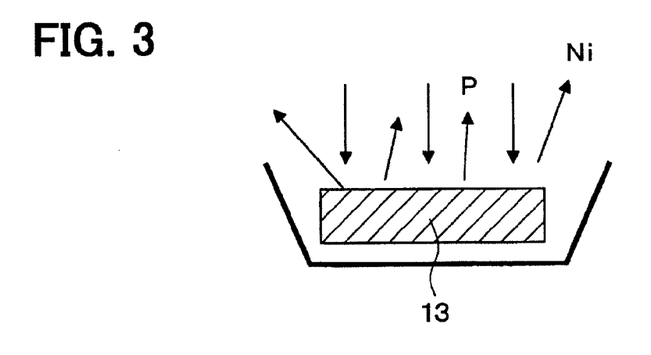
FIG. 3 is a diagram showing a state of a target in a sputtering apparatus.

For example, as shown in FIG. 3, the electrode material including the impurity is disposed in the sputtering apparatus as a target 13, and a sputtering using the target 13 is performed so that the metal thin film 12 including the impurity can be formed on the rear surface 1b of the n+ type substrate 1. When the metal thin film 12 is made of one of the electrode materials that form metal silicide or metal carbide, the electrode material in which the impurity is mixed may be used as the target 13. When the metal thin film is made of both, the mixed material of the electrode materials in which the impurity is mixed or a stacked layer of the electrode materials in which the impurity is mixed may be used.

Although a case where the metal thin film 12 including the impurity is formed by sputtering was described here, the metal thin film 12 including the impurity may be formed by any method, such as a deposition method, a plating method, or a CVD method. In a case of sputtering, because the concentration of the impurity in the target 13 and the concentration of the formed metal thin film 12 become the same level, the concentration of the impurity in the target 13 may be 10 ppm to 2%.

Figure 2C:
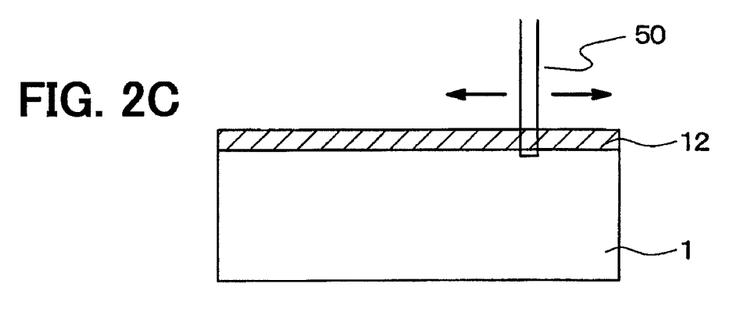
Figure 2D:
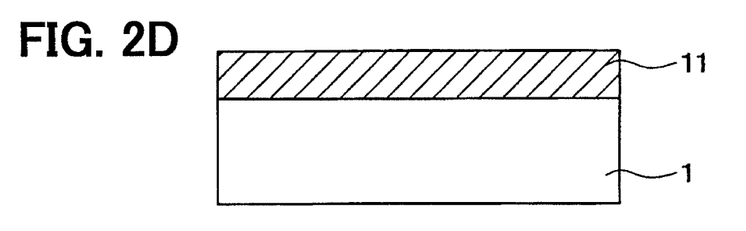
Figure 4A:
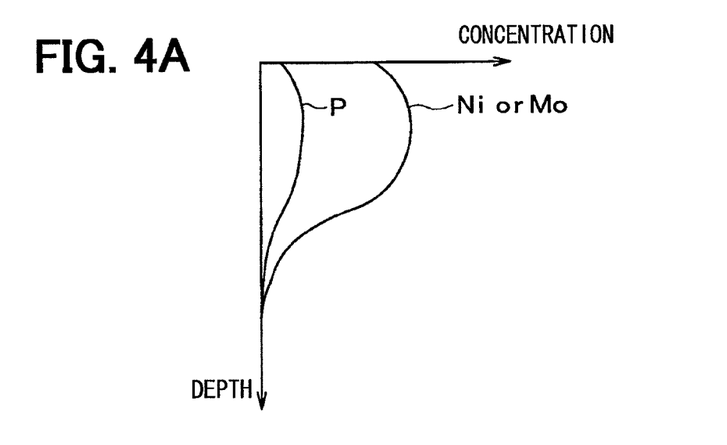
FIG. 4A is a diagram showing a diffusion distribution of an impurity and a metal atom according to the first embodiment.
Figure 4B:
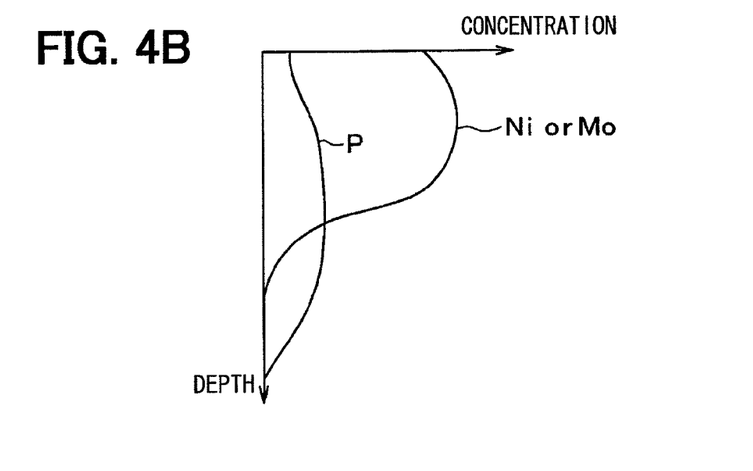
FIG. 4B is a diagram showing a diffusion distribution of an impurity and a metal atom in a case where a metal thin film is formed after ion implantation and activation of the impurity are performed.

In a process shown in FIG. 2C, a laser annealing is performed by irradiating the metal thin film with a laser light. Specifically, a laser light 50 is scanned on the rear surface 1b of the n+ type substrate 1, preferably in such a manner that the only a portion where the metal thin film 12 is formed can be irradiated with the laser light 50 by scanning or masking. Accordingly, a metal atom (for example, Ni or Mo) forming the metal thin layer 12 reacts with Si or C forming the n+ type substrate 1, and as shown in FIG. 2D, the drain electrode 11 including a metal reaction layer made of metal silicide or metal carbide can be formed. At the same time, the impurity included in the metal thin film 12 is diffused and is introduced in the metal reaction layer. A diffusion depth of the impurity and a diffusion depth of the metal atom at a time when the metal reaction layer is formed are almost the same. In addition, distributions of the diffusions are almost the same, and as shown in FIG. 4A, for example, the impurity and the metal atom diffuse to a depth about 200 to 300 nm, and diffuse similarly, and positions of peaks of the concentration after diffusion are almost the same. As reference, as shown in FIG. 4B, after an impurity is ion-implanted to the rear surface 1b of the n+ type substrate 1, a metal thin film that does not include an impurity is formed, and further the laser light is emitted so as to obtain an ohmic junction. In this case, the diffusion depths of impurity and the metal atom are different from each other, and the distributions are different.

When the metal thin film 12 is made of one of the electrode materials that form silicide or carbide with the SiC, the metal reaction layer included in the drain electrode 11 is made of one of metal silicide or metal carbide. When both of the electrode materials are used, the drain electrode 11 is made of the metal reaction layer including the metal silicide and the metal carbide. When both the electrode materials are used, as described above, the mixed material of the electrode materials may be used, or thin films made of respective electrode materials may be stacked. In any case, the metal atom forming the metal thin film 12 and the impurity included in the metal thin film 12 concurrently diffuse toward the rear surface 1b of the n+ type substrate 1 by irradiation of the laser light, and the diffusion depth of the impurity and the diffusion depth of the metal atom are almost the same and the distributions are almost the same.

By the above-described way, the vertical power MOSFET shown in FIG. 1 is completed. By the above-described processes, the impurity included in the metal thin film 12 is diffused, and the drain electrode 11 that includes the metal reaction layer made of metal silicide or metal carbide formed by reaction of the metal atom forming the metal thin film 12 and SiC can be formed. The drain electrode 11 can form the ohmic junction with the rear surface 1b of the n+ type substrate 1 by a structure in which the impurity is introduced in the metal reaction layer. Accordingly, the low resistance ohmic junction can be obtained without an ion implantation of an impurity.

In addition, when the drain electrode 11 is formed by the manufacturing method according to the present embodiment, the impurity is introduced in the metal reaction layer included in the drain electrode 11. Thus, the resistance can be reduced not only by metal silicide or metal carbide but also by the impurity diffusion. The diffusion depth of the impurity is the same as the diffusion depth of the metal atom in metal silicide or metal carbide that forms the metal reaction layer, and the impurity uniformly diffuses in the metal reaction layer. Thus, the resistance of the metal reaction layer can be further reduced. Therefore, the ohmic junction of a lower resistance can be obtained. Especially, in a junction portion of the drain electrode 11 with the rear surface 1b of the n+ type substrate 1 according to the present embodiment, the diffusion of the impurity and the diffusion of the metal atom in the metal reaction layer have the same distribution. Thus, the resistance of the metal reaction layer can be further reduced.

Figure 5:
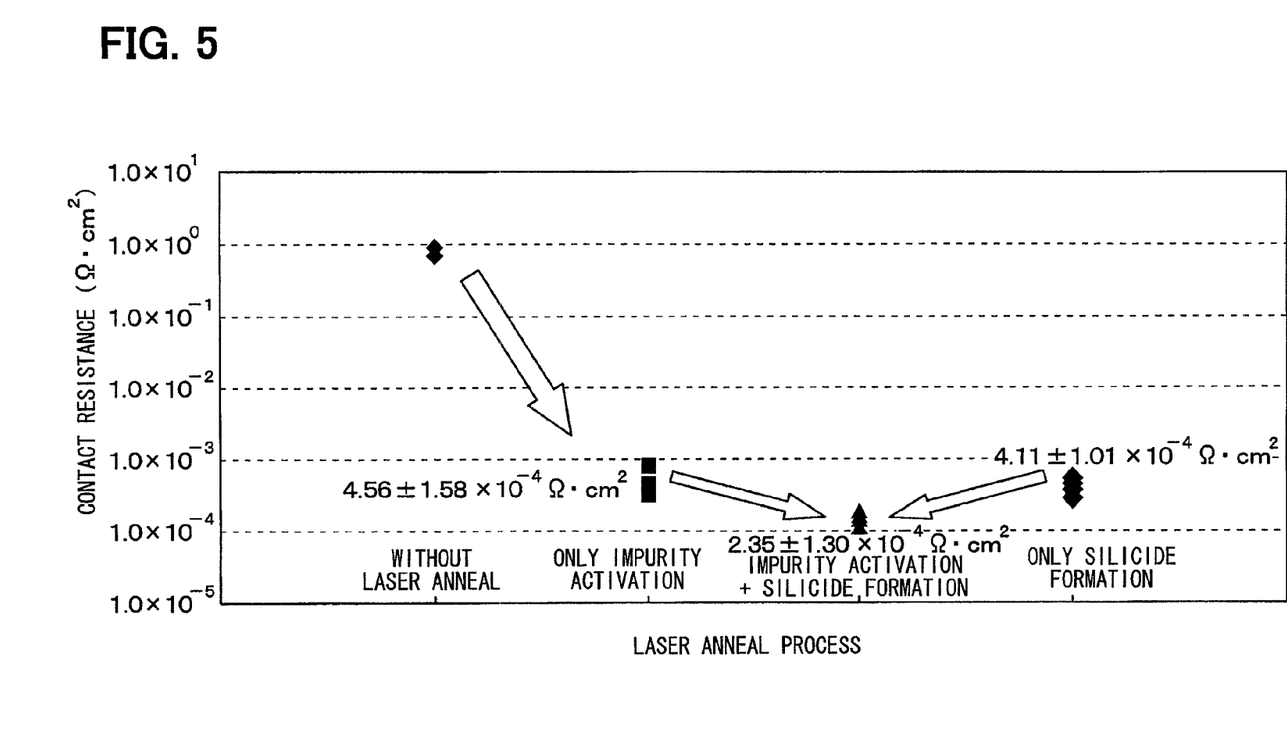
FIG. 5 is a comparison diagram of contact resistances.

By the experiment, a contact resistance at the junction portion of the drain electrode 11 with the rear surface 1b of the n+ type substrate 1 formed by the manufacturing method according to the present embodiment was investigated. In addition, for comparison, contact resistances in a case without ion implantation and laser annealing (case 1), a case where an ion implantation of an impurity and activation by laser annealing were performed (case 2), and a case where silicide was formed by laser annealing (case 3) were investigated. As a result, as shown in FIG. 5, although the contact resistances in the cases 2, 3 are reduced compared with the case 1, the contact resistance in the case 2 is about $4.56 \pm 1.58 \times 10^{-4}$ $\Omega \cdot cm^2$, and the contact resistance in the case 3 is about $4.11 \pm 1.01 \times 10^{-4}$ $\Omega \cdot cm^2$. In contrast, by the manufacturing method according to the present embodiment, the contact resistance is reduced to about $2.35 \pm 1.30 \times 10^{-4}$ $\Omega \cdot cm^2$. Also from this result, it is found that the drain electrode 11 manufactured by the manufacturing method according to the present embodiment can form the low resistance ohmic junction.

Modification of First Embodiment

Figure 6:
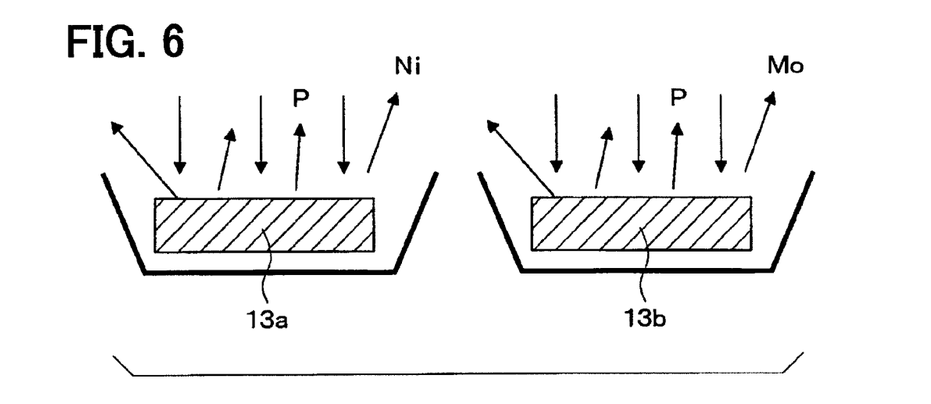
FIG. 6 is a diagram showing a state of a target in a sputtering apparatus described in a modification of the first embodiment.

With respect to the first embodiment, a dual sputtering with two targets 13 of the electrode materials including an impurity may be performed. For example, as shown in FIG. 6, when a sputtering is performed by using Ni including the impurity as one target 13a, and Mo including the impurity as the other target 13b, a metal thin film 12 in which two electrode materials including the impurity are mixed can be formed.

Second Embodiment

A second embodiment of the present disclosure will be described. In the present embodiment, a laser annealing method is changed from the first embodiment, and the others are similar to those of the first embodiment. Thus, only a part different from the first embodiment will be described.

Figure 7:
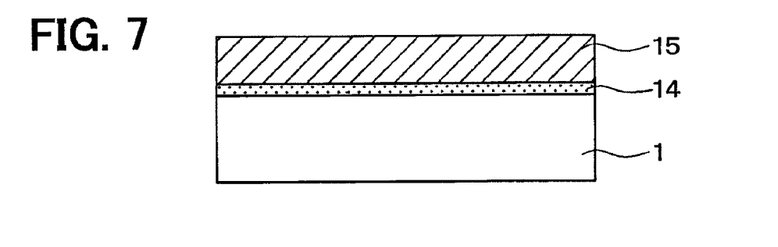
FIG. 7 is a cross-sectional view showing a part of a forming process of a drain electrode in a SiC semiconductor device according to a second embodiment of the present disclosure.

As shown in FIG. 7, in the present embodiment, instead of the metal thin film 12 including the impurity and described in the first embodiment, a stacking structure of an impurity layer 14 in which an impurity is mixed in a SiC layer and a metal layer 15 which becomes electrode material is employed. The impurity layer 14 is formed, for example, by growing a SiC layer in an atmosphere including an impurity as a dopant. The metal layer 15 is formed on a surface of the impurity layer 14, for example, by a sputtering method, a deposition method, a plating method, or a CVD method. A laser annealing is performed by irradiating the stacking structure of the impurity layer 14 and the metal layer 15 with a laser light. Accordingly, the impurity in the impurity layer 14 and the metal atom forming the metal layer 15 can concurrently diffuse toward the rear surface 1b of the n+ type substrate 1. Thus, when the metal atom forming the metal layer 15 reacts with SiC or C that form the n+ type substrate 1 and the impurity layer 2 to form a metal reaction layer made of metal silicide or metal carbide, the impurity is introduced in the metal reaction layer.

Thus, a junction portion of the drain electrode 11 with the n+ type substrate 1 can have a structure similar to the first embodiment. Therefore, even when the laser annealing is performed using the stacking structure of the impurity layer 14 and the metal layer 15 as the present embodiment, effects similar to the first embodiment can be obtained.

When the impurity layer 14 is formed separately from the metal layer 15 as the present embodiment, a difference is generated between a distribution of an impurity diffusion and a distribution of the metal atom. However, depths after distribution are almost the same. Thus, the impurity is uniformly introduced in the metal reaction layer. Thus, the effects similar to the first embodiment can be obtained.

Modification of Second Embodiment

Figure 8:
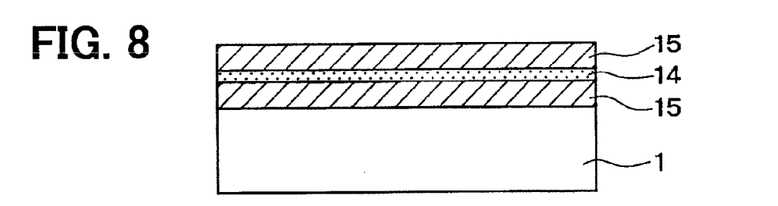
FIG. 8 is a cross-sectional view showing a part of a forming process of a drain electrode described in a modification of the second embodiment.
Figure 9:
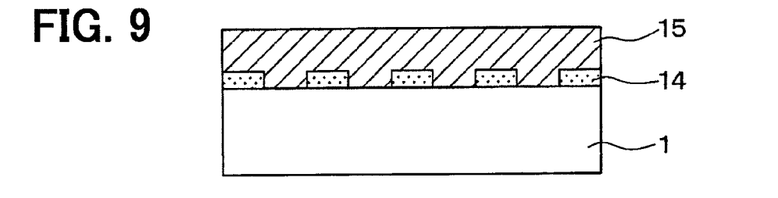
FIG. 9 is a cross-sectional view showing a part of a forming process of a drain electrode described in a modification of the second embodiment.

In the second embodiment, the impurity layer 14 is formed on the rear surface 1b of the n+ type substrate 1. However, as shown in FIG. 8, the impurity layer 14 may be disposed between the metal layers 15. Also note that the impurity layer 14 may be formed on a part of the rear surface 1b of the n+ type substrate 1, and the metal layer 15 may be in contact with the other part of the rear surface 1b of the n+ type substrate 1. For example, as shown in FIG. 9, the impurity layer 14 may be formed in a stripe pattern. Accordingly, in a region where the impurity layer 14 is formed, the impurity is introduced in the metal reaction layer made of metal silicide or metal carbide, and in a region where the impurity layer 14 is not formed, the metal reaction layer includes only metal silicide or metal carbide. Accordingly, an ohmic characteristic can be optionally adjusted.

Other Embodiments

Each of the above-described embodiments has been described with giving the vertical power MOSFET as the example. However, it is only one example, and the present disclosure can be applied to a SiC semiconductor device that includes other semiconductor element, such as a diode or an IGBT. In other words, the present disclosure can be applied to any SiC semiconductor device in which a semiconductor element formed in a semiconductor substrate includes a first electrode that forms an ohmic junction. Also in this case, a laser light irradiation has to be performed at least to a region in the SiC semiconductor device where the first electrode forming the ohmic junction to be formed.

As material of the metal thin film 12 and the metal layer 15, metal such as titanium (Ti) or tungsten (W) can be used as well as Ni and Mo.

What is claimed is:

1. A silicon carbide semiconductor device comprising:
   a semiconductor layer that has a main surface and a rear surface being an opposite surface of the main surface and is made of single crystal silicon carbide; and
   a first electrode that forms an ohmic junction with the semiconductor substrate,
   wherein a junction portion of the first electrode with the semiconductor substrate is formed of a metal reaction layer in which an impurity included in the first electrode is introduced and a metal atom that forms the first electrode reacts with at least one of carbon or silicon that forms the semiconductor substrate, and
   wherein, in the metal reaction layer, a diffusion depth of the impurity and a diffusion depth of the metal atom are the same.

* * * * *